(12) United States Patent
Ryu

(10) Patent No.: US 10,042,393 B2
(45) Date of Patent: Aug. 7, 2018

(54) SOFT DISPLAY DEVICE FOR PORTABLE TERMINAL

(71) Applicant: Sang Kyu Ryu, Uiwang-si (KR)

(72) Inventor: Sang Kyu Ryu, Uiwang-si (KR)

( * ) Notice: Subject to any disclaimer, the term of this patent is extended or adjusted under 35 U.S.C. 154(b) by 0 days.

(21) Appl. No.: 14/710,610

(22) Filed: May 13, 2015

(65) Prior Publication Data

US 2015/0241927 A1 Aug. 27, 2015

Related U.S. Application Data

(63) Continuation of application No. 13/512,009, filed as application No. PCT/KR2009/006952 on Nov. 24, 2009, now Pat. No. 9,107,287.

(30) Foreign Application Priority Data

Nov. 24, 2008 (KR) .................. 10-2008-0116936
Nov. 24, 2009 (KR) .................. 10-2009-0114213

(51) Int. Cl.
*G06F 1/16* (2006.01)
*H04M 1/02* (2006.01)
(Continued)

(52) U.S. Cl.
CPC .......... *G06F 1/1652* (2013.01); *G06F 1/1616* (2013.01); *G06F 1/1624* (2013.01);
(Continued)

(58) Field of Classification Search
CPC ... H04M 1/0247; G06F 1/1615; G06F 1/1652
USPC ...... 455/575.4, 566, 67.14, 552.1, 41.2, 411, 455/556.1, 569.1, 557, 450, 426.1, 418; 345/173, 1.2, 84, 552.1, 629, 420, 102, 345/690; 439/607.01, 55, 620.22, 331,
(Continued)

(56) References Cited

U.S. PATENT DOCUMENTS 7,232,098 B2   6/2007   Rawlings et al.
8,373,979 B2   2/2013   Hamada et al.
(Continued)

FOREIGN PATENT DOCUMENTS

CN   101267466 A   9/2008
EP    1635313 A2   3/2006
(Continued)

OTHER PUBLICATIONS

Inlernalional Search Report for PCT/KR2009/006952 mailed Jul. 16, 2010.

*Primary Examiner* — Hung Duong
(74) *Attorney, Agent, or Firm* — Revolution IP, PLLC

(57) ABSTRACT

Disclosed is a soft display device for a foldable portable terminal, the soft display device including a first and a second folding parts which have been coupled to each other in a foldable manner, and a soft display part comprising a physically exposed portion. Each of the first and second folding parts has first and second outer surfaces, and the first and second outer surfaces face in opposite directions to each other. The first outer surfaces of the first and second folding parts come in contact with each other when the first and second folding parts are folded together. The exposed portion is disposed over the second outer surfaces of the first and second folding parts.

24 Claims, 5 Drawing Sheets

(51) Int. Cl.
*H05K 5/00* (2006.01)
*H05K 5/02* (2006.01)
*H04N 5/645* (2006.01)
*G02F 1/1333* (2006.01)

(52) U.S. Cl.
CPC ........ *G06F 1/1641* (2013.01); *H04M 1/0268* (2013.01); *H05K 5/0017* (2013.01); *H05K 5/0217* (2013.01); *G02F 1/133305* (2013.01); *G02F 1/133308* (2013.01); *H04N 5/645* (2013.01)

(58) Field of Classification Search
USPC ....... 439/405, 73, 76.2, 492, 630, 76.1, 330; 174/261, 562, 59, 71 R; 361/679.02, 361/679.21, 679.22, 679.55, 679.54, 361/679.36, 679.41, 679.09, 679.29, 361/679.26, 679.27, 679.28; 362/136, 362/364, 382, 97.3
See application file for complete search history.

(56) References Cited

U.S. PATENT DOCUMENTS

| | | | |
|---|---|---|---|
| 8,606,340 B2* | 12/2013 | Pegg | H04M 1/0247 455/575.4 |
| 2001/0034249 A1 | 10/2001 | Peugu et al. | |
| 2005/0225951 A1 | 10/2005 | Kurakami | |
| 2006/0038745 A1 | 2/2006 | Naksen et al. | |
| 2006/0050169 A1 | 3/2006 | Misawa | |
| 2006/0079277 A1 | 4/2006 | Ditzik | |
| 2006/0176243 A1 | 8/2006 | Yeh | |
| 2006/0209218 A1 | 9/2006 | Lee et al. | |
| 2008/0151480 A1 | 6/2008 | Chung et al. | |
| 2008/0158795 A1 | 7/2008 | Aoki et al. | |
| 2010/0041439 A1* | 2/2010 | Bullister | G06F 1/1615 455/566 |
| 2011/0002562 A1 | 1/2011 | Chen | |
| 2011/0063195 A1 | 3/2011 | Chou | |
| 2014/0101575 A1* | 4/2014 | Kwak | G06F 1/1616 715/761 |
| 2014/0218321 A1* | 8/2014 | Lee | G06F 1/1652 345/173 |

FOREIGN PATENT DOCUMENTS

| | | |
|---|---|---|
| EP | 1785805 | 5/2007 |
| JP | 2005-309086 A | 11/2005 |
| KR | 1020080020626 | 3/2008 |
| KR | 1020080057909 | 6/2008 |
| WO | WO 2004/053818 A1 | 6/2004 |
| WO | 2006-123297 | 11/2006 |

* cited by examiner

SOFT DISPLAY DEVICE FOR PORTABLE TERMINAL

CROSS-REFERENCE TO RELATED APPLICATION

This application is a Continuation application of U.S. patent application Ser. No. 13/512,009 filed on May 24, 2012, which is a 371 application of PCT International Patent Application No. PCT/KR2009/06952, filed Nov. 24, 2009, which in turn claims priority from Korean Patent Application Nos. 10-2008-0116936, filed Nov. 24, 2008, and 10-2009-0114213, filed Nov. 24, 2009, each of which is incorporated herein by reference in its entirety.

BACKGROUND

The present invention relates to a soft display device for portable terminal, more specifically, a soft display device for portable terminal which can further enlarge screen of the portable terminal (cellular phone, PMP, electronic dictionary, DMB, navigation, notebook, UMPC), thereby providing a user with a wider screen by using the soft display made of soft material to be flexible.

Nowadays it is a trend that the portable terminal become small-sized, slim and light weight considering its portability, thereby providing more various contents. In particular, recently it is necessary to enlarge display of the portable device because the portable terminals appear which can realize various functions such as internet searches etc. For example, the portable is launched in accordance with a trend of putting importances on various entertainment contents such as games and documentary works using spread sheet with the portable terminal.

Such a conventional portable terminal is illustrated FIGS. 1 and 2 described hereinbelow.

FIG. 1 is a perspective view illustrating a conventional portable terminal, and FIG. 2 is a side view illustrating the conventional portable terminal.

Referring to FIGS. 1 and 2, the conventional portable terminal comprises a main body (200) on which key pads etc. are installed, display (101) outputting images and support means (102) supporting the display (101) so that it can be moved.

Here, the display (101) is accommodated in central portion of the main body (200), can be moved in forward/backward directions, and output certain images according to control signal applied from the main body (200).

The main body (200) comprises at its central portion a accommodating part (201) in which the display (101) is accommodated, and on upper surfaces at right and left sides of the accommodating part (201) are disposed key pads which can output respective commanding words if operated by a user.

The support means (102) are fixed to both side surfaces of the display (101), and move the display (101) while sliding inside the main body (200) and support the display (101) in a state of the display having been moved.

Namely, if the user pushes the display (101) of the conventional portable terminal in one direction from a state of the display being accommodated in the accommodating part (201) of the main body (200), the support means (102) slidably inserted inside the main body (200) are moved and accordingly the display (101) is moved.

Here, the main body (200) is exposed on its upper surface as the display (101) is moved, and in the conventional portable terminal there is a case that a separate display is installed in order to provide more various functions.

However, the display of such a conventional portable terminal has an advantage that its screen is divided into upper and lower parts and therefore can output different images, but it has a fundamental problem that the user see images through still small screen since it can not overcome disadvantage associated with size of the portable terminal.

SUMMARY

The present invention has been devised to solve the problems of the prior art described above, and its object is to provide a soft display device for portable terminal which allows images to be output through more enlarged screen than a portable terminal having the same size by using a soft display device.

Another object of the present invention is to provide a soft display device for portable terminal where pushing in and withdrawing of the soft display is made easy by accommodating and fixing the soft display inside the portable terminal and connecting it with the inside of the main body of the portable terminal in the portable terminal equipped with the soft display.

Yet another object of the present invention is to provide a soft display device for portable terminal which can provide a wider screen than that of the portable terminal having small-sized screen such as folder-type terminal.

Yet another object of the present invention is to provide a soft display device for portable terminal which allows for various applications according to shape of the portable terminal and reduction of manufacturing cost by applying display combining soft material and rigid material so that manufacturing cost of the expensive soft display can be reduced.

The present invention includes the following examples in order to achieve the above-mentioned objects.

A first example according to the present invention is characterized in that the soft display device for portable terminal of the present invention comprises a housing inside which an empty space is formed; a display part at least one soft display of which is exposed on upper surface of the housing and extends to the inside of the housing to be accommodated therein so that it can be withdrawn; and support parts which support the soft display accommodated inside the housing.

A second example according to the present invention is characterized in that, in the first example, the support parts comprise a connecting means which is connected with one end portion of the soft display accommodated inside the housing; a rotating means which is formed of a rotatable shaft and an outer surface fixed to one end portion of the connecting means and allows the soft display to be pushed in and withdrawn by pulling or releasing the connecting means by rotation of the rotatable shaft; and catch grooves on both inner side surfaces of the housing formed of grooves in which projections projected from side surfaces of the soft display are catched, thereby stopping movement of the soft display.

A third example according to the present invention is characterized in that, in the first example, the support parts further comprise a rotating means which elastically support the soft display by having a rotatable shaft rotated with elastic force and including an outer surface on which one end portion of the soft display accommodated inside the housing is fixed and rolled; and catch grooves on inner side surfaces of the housing formed of grooves in which projections projected from both side surfaces of the soft display or both side surfaces of a lower slider are catched, thereby stopping movement of the soft display.

A fourth example according to the present invention is characterized in that, in any one of the first to third examples, the soft display device further comprises at least one of a upper slider which guides movement of the soft display while being fixed on back surface of the soft display and slidably engaged with the upper surface of the housing so that it can be moved thereon; and a lower slider which is fixed on back surface of the soft display accommodated inside the housing and slides on inner upper surface of the housing, thereby guiding the soft display.

A fifth example according to the present invention is characterized in that, in the fourth example, the upper slider and the upper surface of the housing have concavo-convex form for engaging with each other and the upper slider can slide while engaging with the upper surface, and the lower slider and the inner upper surface of the housing have concavo-convex form for engaging with each other and the lower slider can slide while engaging with the inner upper surface.

A sixth example according to the present invention is characterized in that, in the fifth example, the upper and lower sliders have concavo-convex structures of trapezoid shape.

A seventh example according to the present invention is characterized in that, in the sixth example of the soft display device for portable terminal, both end portions extending to both sides from the soft display exposed on the upper surface of the housing, respectively are supported by the support parts so that the both end portions can be pushed into the inside of the housing and moved, respectively.

A eighth example according to the present invention is characterized in that, in the sixth example, a first soft display and a second display are combined with each other, which comprise the housing, the upper or lower slider, and the support parts, respectively.

A ninth example according to the present invention is such that in a folder-type portable terminal comprising the soft display device according to any one of the first to eighth examples, the soft display is formed while extending from inner surface of the folder rotated up and downward to open and close upper surface of a main body to upper surface of the main body or from outer surface of the folder to outer surface of the main body.

A tenth example according to the present invention is characterized in that, in the nineth example, an area made of rigid material and an area made of soft material are integrated in the soft display.

As described above, the soft display device for portable terminal according to the present invention provides a wider screen by equipping the portable terminal with the soft display and thus the user can further enjoy contents provided by service providers, and therefore such effects are obtained that the soft display device of the present invention contributes to the increases of conveniences of users and sales of service providers.

Furthermore, the present invention has another effect that pushing in and withdrawing of the soft display is made easy by accommodating and fixing the soft display inside the portable terminal and connecting it with a string or foldable connecting means fixed inside the main body of the portable terminal in the portable terminal equipped with the soft display.

Furthermore, the present invention has yet another effect that an enlarged screen can be provided even in a small-sized terminal since a restricted screen in a folder-type terminal can be enlarged from the folder to the main body by using the soft display.

Furthermore, the present invention has yet another effect that manufacturing cost is reduced and more applications are made possible according to shape of the housing or the types of the portable terminals since display consisting of rigid material and soft material is mounted on the portable terminal.

LISTS OF REFERENCE NUMERALS IN THE DRAWINGS

Figure 1:
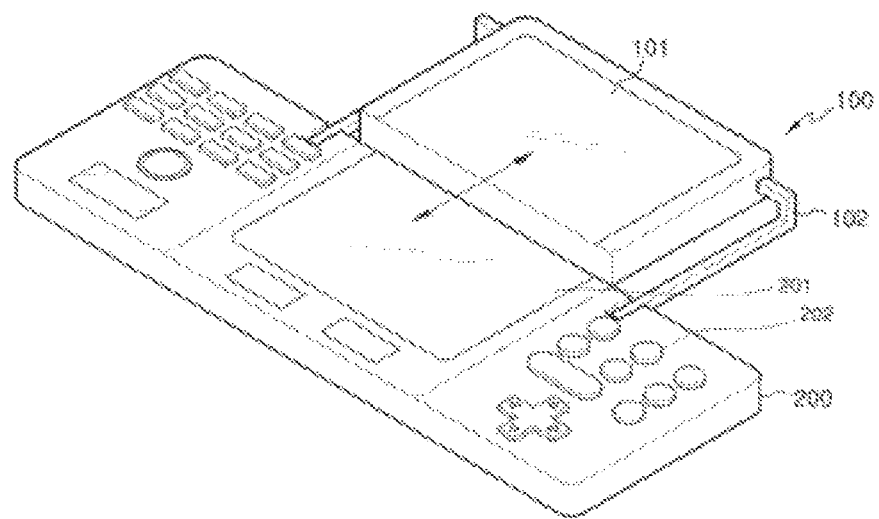
FIG. 1 is a perspective view illustrating a conventional portable terminal.
Figure 2:
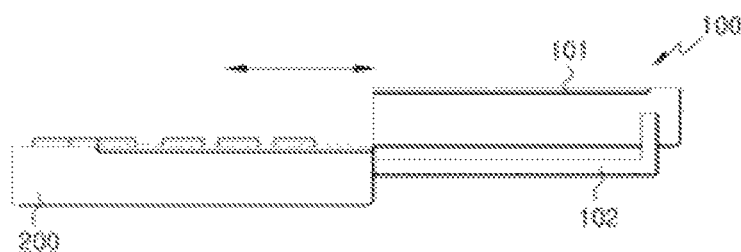
FIG. 2 is a side view of the conventional portable terminal.

100: display part
110: soft display
121: upper slider
122: lower slider
130: connecting means
140: rotating means
200: main body
210: housing
211: withdrawing hole
212: upper surface of housing
213: inner upper surface of housing

DETAILED DESCRIPTION

The present invention includes the following examples in order to achieve the above-mentioned objects.

A first example according to the present invention is characterized in that the soft display device for portable terminal of the present invention comprises a housing inside which an empty space is formed; a display part at least one soft display of which is exposed on upper surface of the housing and extends to the inside of the housing to be accommodated therein so that it can be withdrawn; and support parts which support the soft display accommodated inside the housing.

A second example according to the present invention is characterized in that, in the first example, the support parts comprise a connecting means which is connected with one end portion of the soft display accommodated inside the housing; and a rotating means which is formed of a rotatable shaft rotated by elastic force of a spring and an outer surface fixed to one end portion of the connecting means and allows the soft display to be pushed in and withdrawn by pulling or releasing the connecting means by rotation of the rotatable shaft.

A third example according to the present invention is characterized in that, in the first example, the support parts further comprise a rotating means which elastically support the soft display by having a rotatable shaft rotated by elastic force of a spring and including an outer surface on which one end portion of the soft display accommodated inside the housing is fixed and rolled; and catch grooves on inner side surfaces of the housing formed of grooves in which projections projected from both side surfaces of the soft display or both side surfaces of a lower slider are catched, thereby stopping movement of the soft display.

A fourth example according to the present invention is characterized in that, in any one of the first to third examples, the soft display device further comprises at least one of a upper slider which guides movement of the soft display while being fixed on back surface of the soft display and slidably engaged with the upper surface of the housing so that it can be moved thereon; and a lower slider which is fixed on back surface of the soft display accommodated inside the housing and slides on inner upper surface of the housing, thereby guiding the soft display.

A fifth example according to the present invention is characterized in that, in the fourth example, the upper slider and the upper surface of the housing have concavo-convex form for engaging with each other and the upper slider can slide while engaging with the upper surface, and the lower slider and the inner upper surface of the housing have concavo-convex form for engaging with each other and the lower slider can slide while engaging with the inner upper surface.

A sixth example according to the present invention is characterized in that, in the fifth example, the upper and lower sliders have concavo-convex structures of trapezoid shape.

A seventh example according to the present invention is characterized in that, in the sixth example of the soft display device for portable terminal, both end portions extending to both sides from the soft display exposed on the upper surface of the housing, respectively are supported by the support parts so that the both end portions can be pushed into the inside of the housing and moved, respectively.

A eighth example according to the present invention is characterized in that, in the sixth example, a first soft display and a second display are combined with each other, which comprise the housing, the upper or lower slider, and the support parts, respectively.

A ninth example according to the present invention is characterized in that, in the portable terminal equipped with a folder rotated up and downward and a main body, the soft display of the soft display device for portable terminal according to the first to eighth examples is formed while extending from inner surface of the folder rotated up and downward to open and close upper surface of a main body to upper surface of the main body or from outer surface of the folder to outer surface of the main body.

A tenth example according to the present invention is characterized in that, in the nineth example, an area made of rigid material and an area made of soft material are integrated in the soft display.

Hereinbelow, preferred examples of the soft display device for portable terminal according to the present invention will be described in detail with reference to the attached drawings.

Figure 3:
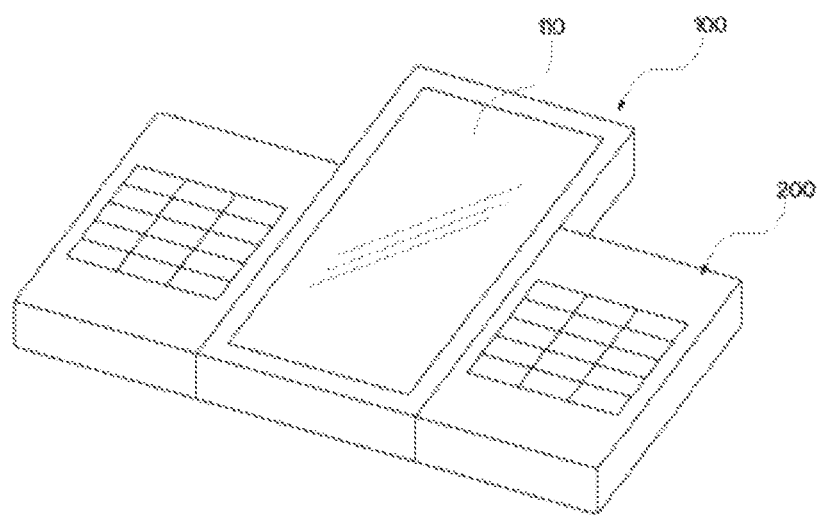
FIG. 3 is a perspective view illustrating a soft display device for portable terminal according to the present invention.
Figure 4:
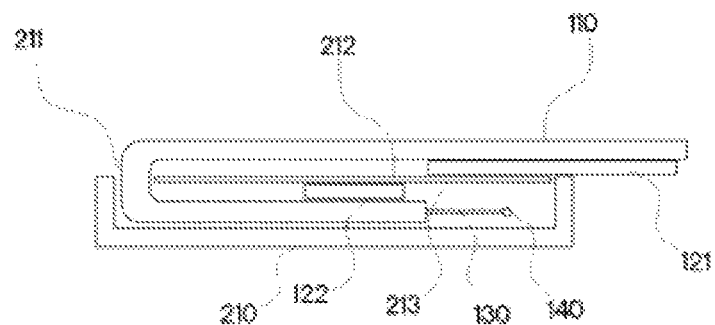
FIG. 4 is a side sectional view of the soft display device for portable terminal according to the present invention.

FIG. 3 is a perspective view illustrating the soft display device for portable terminal according to the present invention, and FIG. 4 is a side sectional view of the soft display device for portable terminal according to the present invention.

Referring to FIGS. 3 and 4, the soft display device for portable terminal according to the present invention has a display part (100) and a main body (200). The display part (100) is a soft display, one end portion of which can be pushed in and withdrawn inside the main body (200), and the other portion of which is exposed on upper surface of the main body (200). The main body (200) comprises a housing (210); support parts (at least one of "130" and "140") which support one portion of the soft display (110) accommodated inside the housing (210) so that the portion can be moved and accommodated; a upper slider (121) which supports the exposed portion of the soft display (110) on upper surface (212) of the housing (210) so that the portion can be slidingly moved; and a lower slider (122) which supports the other portion of the soft display (110) accommodated inside the main body (200) on inner upper surface (213) of the housing (210) so that the other portion can be moved.

The soft display (110) includes the portion exposed to the outside on the upper surface of the housing (210) and the other portion formed while extending from the exposed portion to the inside of the housing (210), and extends onto the upper surface (212) of the housing (210) while being bent inside the housing (210) due to property of its material. Therefore, if a user pushes one side of the soft display (110) exposed on the upper surface (212) of the housing (210), the soft display (110) is moved in one direction, thus the other side accommodated inside the housing (210) is withdrawn to be moved onto the upper surface (212) of the housing (210).

Here, for the soft display, a display of rigid material consisting of OLED or LCD and a soft display of soft material are integrated into a single display, which is applicable to the present invention. Namely, by way of example, to the present invention is applicable a display of composite material in which the area of the display of soft material is formed while extending from the area of the display of rigid material in a single display. Description thereof is as follows. The area of the display of rigid material is positioned on the upper surface (212) of the housing (210), and the area of the display of soft material formed while extending from the display of rigid material is accommodated inside the housing and can be bent when moved, thereby allowing the area of the display to be enlarged.

Therefore, the user can see image through a larger screen by operating image output-commanding key (not illustrated) in a state that both of the portion exposed on the upper surface (212) of the housing (210) and the display accommodated inside the housing (210) are exposed on the upper surface (212) of the housing (210).

The housing (210) is made of plastic and the like constituting the outside of the main body (200) and an empty space is formed inside the housing. Here, the housing (210) comprises an engagement structure where the housing engages with the upper slider (121) on the upper surface (212) so that the upper slider can be moved, and engages with the lower slider (122) on the inner upper surface (213) so that the lower slider can be moved. This structure is the same as illustrated in FIG. 5 described hereinbelow, and the upper slider, the lower slider and the housing will be described with reference to FIG. 5 together with FIGS. 3 and 4.

Figure 5:
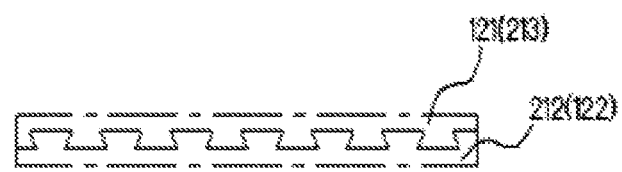
FIG. 5 is a sectional view schematically illustrating an example of engagement structure of the soft display in the soft display device for portable terminal according to the present invention.

FIG. 5 is a sectional view schematically illustrating an example of the engagement structure of the soft display in the soft display device for portable terminal according to the present invention.

Referring to FIG. 5, the housing (210) is formed on its upper surface (212) with concavo-convex grooves with which the upper slider (121) movably engages, and on its inner upper surface (213) with concavo-convex grooves with which the lower slider (122) movably engages. Here, the concavo-convex grooves are characterized by its trapezoid shape.

The upper slider (121) is fixed to back surface of one end portion in the soft display (110), and slidably engages with the concavo-convex grooves of the upper surface (212) of the housing (210). Namely, the upper slider (121) is formed on its lower surface with concavo-convex grooves which engage with the concavo-convex structure of the upper surface (212) of the housing so that the upper slider can be moved. Therefore, if the user applies force to the one side exposed on the upper surface (212) of the housing (210), the upper slider slides along the upper surface (212) of the housing (210) while at the same time supporting the soft disply (110). Here, it is preferable to add a catch construction by which the movement of the upper slider is blocked if the upper slider reaches a pre-determined position on the upper surface of the housing.

Namely, for concavo-convex-type moving structure of the upper slider and the upper surface of the housing, it is preferable to form catch grooves (not illustrated) at end portion of the upper surface of the housing and on the upper slider add projections (not illustrated) which is catched in the catch grooves of the upper surface of the housing. In general, it is possible to apply the known prior art to a fixing structure of the upper slider (121) described above, thus detailed description thereof will be omitted.

The lower slider (122) includes concavo-convex grooves engaging with the concavo-convex grooves of the inner upper surface (213) of the housing (210) and supports pushing-in and withdrawing of the soft display (110) while sliding along the inner upper surface (213) of the housing (210). Therefore, the lower slider (122) supports the soft display (110) while sliding at the same time as movement of the soft display (110). At this point, the soft display (110) is withdrawn to the outside through a withdrawing hole (211) of the housing (210).

Here, it is possible to install only any one of the upper slider (121) and the lower slider (122), and the both sliders are installed together to guide movement of the soft display (110) and support the display so as to maintain an enlarged shape resulting from completion of withdrawing of the soft display (110).

Figure 6:
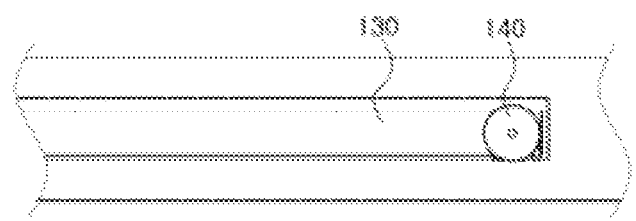
FIG. 6 is a side view illustrating a fixing structure for the soft display in the soft display device for portable terminal according to the present invention.

Furthermore, the present invention comprises the support parts (130, 140) which elastically support the soft display (110) so that the soft display (110) described above can be pushed in and withdrawn, which is the same as illustrated in FIG. 6.

Referring to FIG. 6, the support parts comprise a connecting means (130) which is connected with the other end portion of the soft display inside the housing (210) and a rotating means (140) which comprises a rotatable shaft (not illustrated) connected with the opposite end portion of the connecting means (130) and can be rotated by elastic force.

Here, the connecting means (130) is a string or a foldable rod, and at its one end portion is connected with the other end portion of the soft display (110) accommodated inside the housing (210) so that it can be moved and at its opposite end portion is fixed to outer surface of the rotating means (140) and applies force to the soft display (110) according to rotational direction of the rotating means (140).

The rotating means (140) pulls the soft display (110) with a constant force according to rotational direction of rotatable shaft (not illustrated) having the elastic force. Therefore, the rotating means (140) rotates in forward direction for example to release the connecting means (130) when the soft display (110) is withdrawn, and pulls the connecting means (130) with the elastic force of the rotating means (140) if the soft display (110) applies opposite directional force while returning to its original position.

Here, the rotating means (140) has spring (not illustrated) therewithin and the spring is contracted or expanded according to the rotational direction, thus applies the elastic force so that the rotatable shaft can rotate in forward/backward directions.

Here, according to another example of the present invention, it is possible to roll the other end portion itself of the soft display (110) on the outer surface of the rotating means (140) instead of providing the connecting means (130). Namely, as described above, though the soft display (110) comprises a construction where it is returned by the elastic force of the rotating means (140) by means of the connecting means (130), according to another example, the other end portion of the soft display (110) may be rolled on the outer surface of the rotating means (140), and such a construction also falls within the scope of technical concepts of the present invention.

In addition, in the present invention, since the connecting means (130) is pulled at the time of moving of the lower slider (122) as described above, the rotating means (140) releases the connecting means (130) while rotating in one direction. At this point, it is preferable to add a catch construction which blocks the movement of the soft display (110) or the lower slider (122) inside the housing (210) since the soft display (110) is returned to its original position by the elastic force of the rotating means (140) if the movement of the soft display (110) is completed, Namely, for example, it is preferable that projections (not illustrated) are provided on both side surfaces of the soft display (110) or both side surfaces of the lower slider, respectively and on inner side surfaces of the housing (210) are provided catch grooves (not illustrated) in which the projections are catched.

Therefore, if the soft display (110) or the lower slider (122) reaches a pre-determined position, the projections (not illustrated) disposed on the both side surfaces are catched in the catch grooves (not illustrated), thus even though the user does not apply force to the soft display (110), the soft display (110) or the lower slider (122) is prevented from returning to its original position by the elastic force of the rotating means (140).

On the contrary, if the user moves the soft display (110) in the opposite direction, the projections (not illustrated) catched in the catch grooves (not illustrated) is released therefrom, thus the soft display (110) returns to its original position by the elastic force of the rotating means (140). Here, though constructions of the projections and the catch grooves described above are not illustrated in the drawings, it can be embodied in the present invention and generally the known catch construction for the slider can be applied, thus drawing and description regarding its detailed construction will be omitted.

The present invention is characterized in that image part outputting images of the portable terminal (cellular phone, electronic dictionary, notebook, PMP, navigation, DMB) provides wider screen compared prior art through the soft display, and for this purpose has proved that the technical skills described above is realizable construction by including structure of accommodating and supporting the soft display described above. Furthermore, in the present invention, such various examples as follows can be constructed based on the above-mentioned technical concepts.

Figure 7:
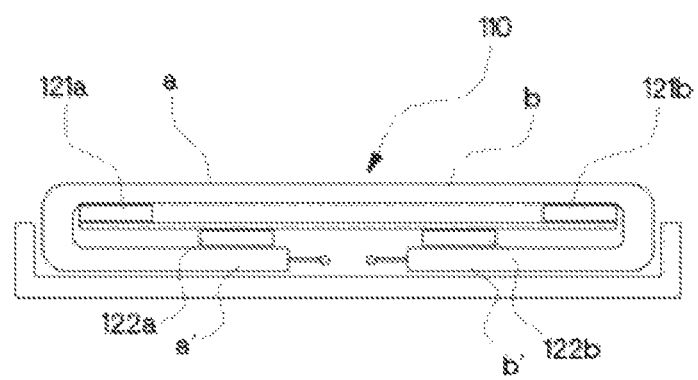
FIG. 7 is a side sectional view illustrating a second example of the soft display device for portable terminal according to the present invention.

FIG. 7 is a side sectional view illustrating a second example of the soft display device for portable terminal according to the present invention.

Referring to FIG. 7, the second example of the present invention can provide a wider screen than that provided by the soft display of the preferred example described above in detail. For the sake of description, the soft display (110) having longer length than that of the housing (210) of the main body (200) divides the area positioned on the upper surface (212) of the housing (210) into a first surface (a) and a second surface (b), and comprises a first side (a') which extends from the first surface (a) to one side and can be pushed in and withdrawn inside the housing (210) and a second side (b') which extends from the second surface (b) to the other side and can be pushed in and withdrawn inside the housing (210).

Here, the first side (a') and the second side (b') are supported inside the housing (210) by separate support parts (130, 140), respectively.

The first side (a') is supported by a first upper slider (121a) and a first lower slider (122a) on the upper surface (212) and the inner upper surface (213) of the housing (210), respectively, and the second side (b') is supported by a second upper slider (121b) and a second lower slider (122b), respectively. In addition, the first side (a') and the second side (b') are connected with different connecting means (130), respectively and supported by the elastic force of the rotating means (140) or also may be supported in a state that both end portions of the soft display (110) are rolled on the outer surface of the rotating means (140).

Figure 8:
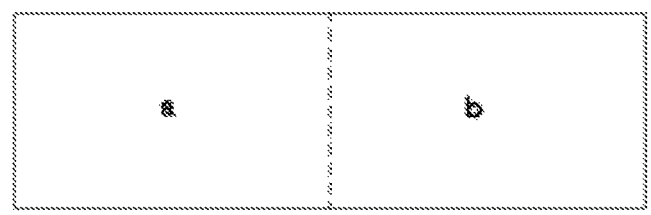
FIGS. 8 and 9 are plane views for explaining operations of the second example of the soft display device for portable terminal according to the present invention.
Figure 9:
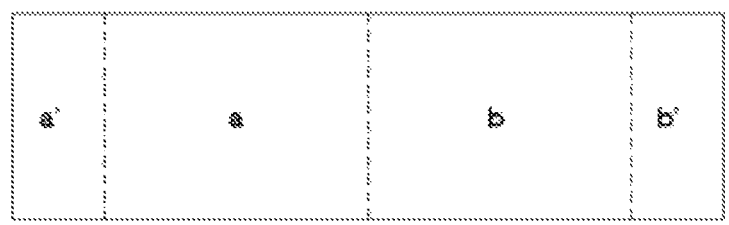

FIGS. 8 and 9 are plane view for explaining operations of the second example of the soft display device for portable terminal according to the present invention.

Referring to FIGS. 8 and 9, as illustrated, the soft display according to the present invention can divide the portion exposed on the upper surface (212) of the housing (210) into the first surface (a) and the second surface (b), respectively. Here, the first side (a') and the second side (b') are in a state of being accommodated inside the housing (210), which can not be identified in FIG. 8. However, if the user withdraws the first side (a') and the second side (b'), as described above, the first and second sides are withdrawn by operations of the support parts (130, 140), the upper sliders (121a, 121b) and the lower sliders (122a, 122b) as illustrated in FIG. 9, thereby being exposed while extending from both sides of the first surface (a) and the second surface (b), respectively.

Therefore, the user can be provided with image service through a wider screen compared with screen provided by the preferred example described above.

Figure 10:
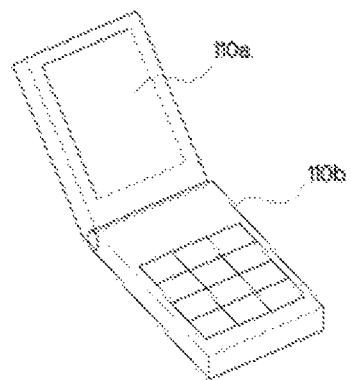
FIG. 10 is a perspective view illustrating a conventional folder-type portable terminal for the purpose of explaining a third example of the soft display device for portable terminal according to the present invention by comparison.

FIG. 10 is a perspective view illustrating a conventional folder-type portable terminal for the purpose of explaining a third example of the soft display device for portable terminal according to the present invention by comparison.

Referring to FIG. 10, in general, the folder-type cellular phone is equipped with a display (110) in the folder (100a) as illustrated, and the display outputs images, and the main body (200) is equipped with key pads for user's operation. In such a folder-type cellular phone, the size of the folder itself is small in nature, thus there is no choice but to provide a small screen. However, in the present invention, it is possible to embody a construction shown in FIG. 11 by means of the support parts (130, 140), sliders (121, 122) and the soft display (110) described above.

Figure 11:
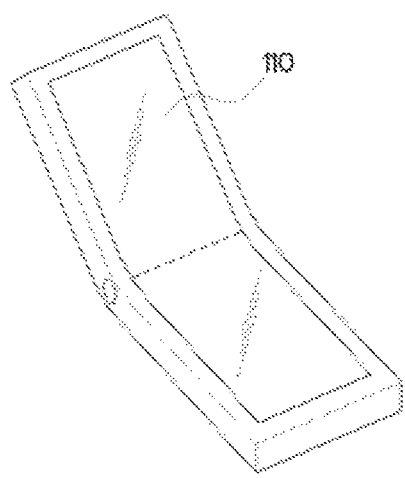
FIGS. 11 and 12 are perspective views illustrating the third example of the soft display device for portable terminal according to the present invention.
Figure 12:
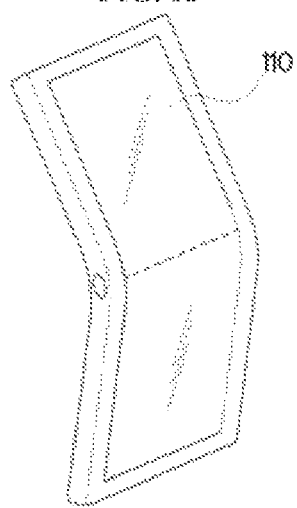

FIGS. 11 and 12 are perspective views illustrating a third example of the soft display device for portable terminal according to the present invention.

Referring to FIGS. 11 and 12, the third example of the present invention has a soft display (110) extending in one piece from upper side of the folder (100a) to lower side of the main body (200) in the folder-type cellular phone. Here, if the folder (100a) is rotated from a state that the soft display is accommodated while pushed into the inside of the main body (200) and the folder (100a) at end portions of upper side of the folder and lower side of the main body (200), both portions of the soft display accommodated inside the folder and the main body (200) are withdrawn, thereby providing a wider screen.

In the present invention, it is possible that the soft display is formed while extending from the inside of the folder (100a) to the main body (200) as illustrated, and in addition, as illustrated in FIG. 12, the soft display (110) is provided outside the folder (100a) and the main body (200), which also falls within the scope of the technical concepts of the present invention.

Figure 13:
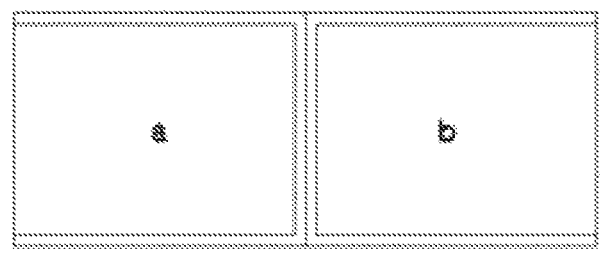
FIGS. 13 and 14 are views illustrating a fourth example of the soft display device for portable terminal according to the present invention.
Figure 14:
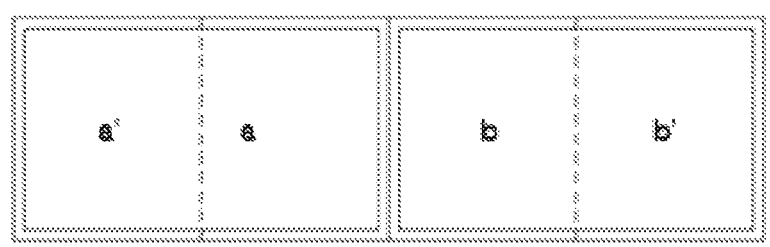

FIGS. 13 and 14 are views illustrating a fourth example of the soft display device for portable terminal according to the present invention.

Referring to FIGS. 13 and 14, the fourth example of the present invention shows a construction where at least one soft display device (110a, 110b) are combined which are supported inside the housing (210) by the support parts (130, 140) described above so that it can be pushed in and withdrawn. Namely, in the present invention, the first soft display (110a) and the second soft display (110b) may be combined with each other at one side of each of them to be mounted on a single portable terminal.

For the sake of detailed description, the first soft display (110a) and the second soft display (110b) are independent soft displays and in a state of being combined with each other at one surface of each of them. Furthermore, any one of the first soft display (110a) and the second soft display (110b) is supported by the support parts (130, 140) and the upper slider (122) or the lower slider (123) inside the housing (210) or the main body (200) described above of the respective display device.

Therefore, if the user withdraws one portion (110a', 110b') of each of the first soft display (110a) and the second soft display (110b) accommodated inside the housing (210) by moving the two soft displays, the first soft display (110a) and the second soft display (110b) can be enlarged in any one direction as seen in FIG. 13.

As described above, the present invention can enlarge the screen of the portable terminal by using the soft display, thereby providing the user with enlarged screen, and thus one can further enjoy contents provided by service providers and therefore the present invention is very useful.

The present invention is not limited to the preferred examples having features described above, and it goes without saying that the persons having ordinary skills in the art may implement the present invention by modification thereof without departing from gist of the present invention defined by the claims, and such modification also falls within the scope of the claims.

What is claimed is:

1. A soft display device for a foldable portable terminal, the soft display device comprising:
   a first and a second folding parts which have been coupled to each other in a foldable manner; and
   a soft display part comprising a physically exposed portion;
      wherein each of the first and second folding parts has a first and a second outer surfaces, and the first and second outer surfaces face in opposite directions to each other,
      wherein, when the first and second folding parts are folded together, the first outer surfaces of the first and second folding parts come in contact with each other,
      and wherein the exposed portion is disposed over the second outer surfaces of the first and second folding parts.

2. The soft display device of claim 1, wherein the first and second folding parts are folded together through a hinge.

3. The soft display device of claim 1, wherein an connecting means is connected to one side or both sides of the soft display device in order to prevent the exposed portion of the soft display device from being spaced in the direction farther away from a folding axis when the first and second folding parts are folded or unfolded, the connecting means is an elastic device.

4. The soft display device of claim 3, the elastic device comprises a string or a foldable rod.

5. The soft display device of claim 1, the soft display device further comprises a slider which is withdrawn from at least one of the first and second folding parts.

6. The soft display device of claim 1, wherein the soft display part further comprises an unexposed portion which extends from the exposed portion and is received in the first and/or second folding parts such that the first and/or second folding parts are withdrawn to be bent.

7. The soft display device of claim 3 or 6, further comprising a support part which supports the unexposed portion such that the exposed portion is pushed in or withdrawn inside or outside the first and/or second folding parts.

8. The soft display device of claim 3 or 6, wherein the unexposed portion is pushed in or withdrawn inside or outside the first and/or second folding parts when the first and second folding parts are folded together.

9. The soft display device of claim 7, wherein the support part comprises a connecting means having one end portion connected to the unexposed portion, and a rotating means connected to another end portion of the connecting means so as to pull or release the connecting means.

10. The soft display device of claim 7, wherein the support part comprises a rotating means connected to the unexposed portion in order to pull or release the unexposed portion.

11. The soft display device of any one of claims 1 to 3, further comprising a first slider disposed on one side or both sides between the second outer surfaces of the first and/or second folding parts and the exposed portion of the soft display part.

12. A soft display device for a foldable portable terminal, the soft display device comprising:
   a first and a second folding parts which have been coupled to each other in a foldable manner; and
   a soft display part comprising a physically exposed portion;
      wherein each of the first and second folding parts has a first and a second outer surfaces, and the first and second outer surfaces face in opposite directions to each other,
      wherein, when the first and second folding parts are folded together, the first outer surfaces of the first and second folding parts come in contact with each other,
      and wherein the exposed portion is disposed over the first outer surfaces of the first and second folding parts,
   wherein a connecting device is connected to one side or both sides of the soft display part in order to prevent the exposed portion of the soft display part from being spaced in the direction farther away from a folding axis when the first and second folding parts are folded or unfolded, and
   wherein the connecting device is an elastic device.

13. A soft display device for a foldable portable terminal, the soft display device comprising:
   a first and a second folding parts which have been coupled to each other in a foldable manner; and
   a soft display part comprising a physically exposed portion;
      wherein each of the first and second folding parts has a first and a second outer surfaces, and the first and second outer surfaces face in opposite directions to each other,
      wherein, when the first and second folding parts are folded together, the first outer surfaces of the first and second folding parts come in contact with each other, and
      wherein the exposed portion is disposed over the first outer surfaces of the first and second folding parts,
   and the soft display device further comprising a slider which is withdrawn from at least one of the first or second folding parts.

14. A soft display device for a foldable portable terminal, the soft display device comprising:
   a first and a second folding parts which have been coupled to each other in a foldable manner; and
   a soft display part comprising a physically exposed portion;
      wherein each of the first and second folding parts has a first and a second outer surfaces, and the first and second outer surfaces face in opposite directions to each other,
      wherein, when the first and second folding parts are folded together, the first outer surfaces of the first and second folding parts come in contact with each other,
      and wherein the exposed portion is disposed over the first outer surfaces of the first and second folding parts,
   wherein the soft display part further comprises an unexposed portion which extends from the exposed portion and is received in the first and/or second folding parts such that the first and/or second folding parts are withdrawn to be bent.

15. The soft display device of any one of claims 12 to 14, further comprising a support part which supports the unexposed portion such that the exposed portion is pushed in or withdrawn inside or outside the first and/or second folding parts.

16. The soft display device of any one of claims 12 to 14, wherein the unexposed portion is pushed in or withdrawn inside or outside the first and/or second folding parts when the first and second folding parts are folded together.

17. The soft display device of claim 16, wherein the support part comprises a connecting means having one end portion connected to the unexposed portion, and a rotating means connected to another end portion of the connecting means so as to pull or release the elastic device.

18. The soft display device of claim 17, wherein the elastic device comprises a string or a foldable rod.

19. The soft display device of claim 14, wherein the support part comprises a rotating means connected to the unexposed portion in order to pull or release the unexposed portion.

20. The soft display device of any one of claim 12 to 14 or 18, further comprising a first slider disposed on one side or both sides between the second outer surfaces of the first and/or second folding parts and the exposed portion of the soft display part.

21. A soft display device for a foldable portable terminal, the soft display device comprising:

a first and a second folding parts which have been coupled to each other in a foldable manner; and a soft display part comprising a physically exposed portion substantially in the outer surface of the first or second folding part;

wherein each of the first and second folding parts has a first and a second outer surfaces, and the first and second outer surfaces face in opposite directions to each other, and wherein, when the first and second folding parts are folded together, the display part of the exposed portion extends from the outer surface of any one of the folding parts of the first and second folding parts to a receiving part of the other folding parts, or the display part of the exposed portion extends from the first outer surface of any one of the folding parts to the second outer surface of any one of the folding part.

22. The soft display device of claim 21, further comprising a slider disposed on the exposed portion of the soft display part.

23. The soft display device of claim 21, wherein one end of the soft display part is connected to the elastic device.

24. The soft display device of claim 23, wherein the elastic device comprises a string or a foldable rod.

* * * * *